(12) United States Patent
Wei et al.

(10) Patent No.: US 7,632,736 B2
(45) Date of Patent: Dec. 15, 2009

(54) SELF-ALIGNED CONTACT FORMATION UTILIZING SACRIFICIAL POLYSILICON

(75) Inventors: Max Wei, San Jose, CA (US); Been-Jon Woo, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/002,752

(22) Filed: Dec. 18, 2007

(65) Prior Publication Data

US 2009/0155995 A1      Jun. 18, 2009

(51) Int. Cl.
H01L 21/76    (2006.01)
H01L 21/265   (2006.01)
H01L 21/425   (2006.01)
H01L 21/4763  (2006.01)
H01L 21/44    (2006.01)

(52) U.S. Cl. .................. 438/424; 438/400; 438/448; 438/435; 438/523; 438/533; 438/629; 438/669; 438/672; 438/675; 257/E21.545; 257/E21.546; 257/E21.547; 257/E21.585; 257/E21.657

(58) Field of Classification Search .......... 257/E21.545, 257/E21.546, E21.547, E21.585, E21.587, 257/E21.657–E21.659
See application file for complete search history.

(56) References Cited

U.S. PATENT DOCUMENTS

| 5,272,104 | A  | * | 12/1993 | Schrantz et al. | 438/105 |
| 5,930,640 | A  | * | 7/1999  | Kenney          | 438/396 |
| 5,981,992 | A  | * | 11/1999 | Kenney          | 257/308 |
| 6,350,671 | B1 | * | 2/2002  | Brambilla et al.| 438/618 |
| 6,548,374 | B2 | * | 4/2003  | Chung           | 438/424 |
| 6,867,074 | B2 | * | 3/2005  | Tsao            | 438/149 |
| 7,361,974 | B2 | * | 4/2008  | Graf            | 257/637 |
| 2001/0023954 | A1 | * | 9/2001  | Lee et al.   | 257/296 |
| 2001/0053575 | A1 | * | 12/2001 | Noble        | 438/238 |
| 2005/0285148 | A1 | * | 12/2005 | Chen et al.  | 257/208 |
| 2007/0218682 | A1 | * | 9/2007  | Lee et al.   | 438/639 |

* cited by examiner

*Primary Examiner*—Charles D Garber
*Assistant Examiner*—Mohsen Ahmadi
(74) *Attorney, Agent, or Firm*—Ryder IP Law; Douglas J. Ryder

(57) ABSTRACT

In general, in one aspect, a method includes forming a spacer layer over a substrate having patterned stacks formed therein and trenches between the patterned stacks. A sacrificial polysilicon layer is deposited over the substrate to fill the trenches. A patterning layer is deposited over the substrate and patterned to define contact regions over at least a portion of the trenches. The sacrificial polysilicon layer is etched using the patterned patterning layer to form open regions.

12 Claims, 8 Drawing Sheets

SELF-ALIGNED CONTACT FORMATION UTILIZING SACRIFICIAL POLYSILICON

BACKGROUND

Semiconductor devices continue to be scaled to smaller sizes. Various design and/or process parameters may limit the scalability of the devices. The alignment of contact holes formed between layers in a semiconductor substrate is one area where scaling is limited due to the need for sufficient contact space on the lower layer to allow for alignment of the contact holes. Self-aligned contacts (SAC) are one approach to aggressively scale the contact space. SAC relies on lithographic patterning and etching of an oxide gap fill material to create the contact holes in the below layers. Due to the etch selectivity of the oxide gap fill material and spacer layers (e.g., nitride) the resultant contact holes may have a sloped or eroded profile. This can lead to undesired process variability and variability in the fill density of the SAC. Furthermore, the patterning of the oxide layer is not easily scalable for lithography and presents increased risk for resist island lifting defects at smaller feature sizes. Moreover, the SAC flow may require the purchase of an advanced dielectric etch tool to support the high selectivity and control requirements.

BRIEF DESCRIPTION OF THE DRAWINGS

The features and advantages of the various embodiments will become apparent from the following detailed description in which.

DETAILED DESCRIPTION

A sacrificial polysilicon layer may be utilized in the formation of the SAC. The etch properties of the sacrificial polysilicon results in a substantially aligned profile without the need for high selectivity etch tools. The sacrificial polysilicon layer flow can print resist "slots" to define contacts (e.g., drain/source plugs) so that it can be scaled to smaller sizes without the need for advanced lithography tools and the lifted resist defects are substantially eliminated.

FIGS. 1-9 illustrate an example process flow for forming drain isolation plugs, drain contact plugs, and source rail contact plugs (e.g., for a NOR memory cell) using polysilicon SAC (PSAC). The process includes patterning the polysilicon, a first etch of the polysilicon based on the pattern, and then a second etch to remove the remaining polysilicon.

Figure 1:
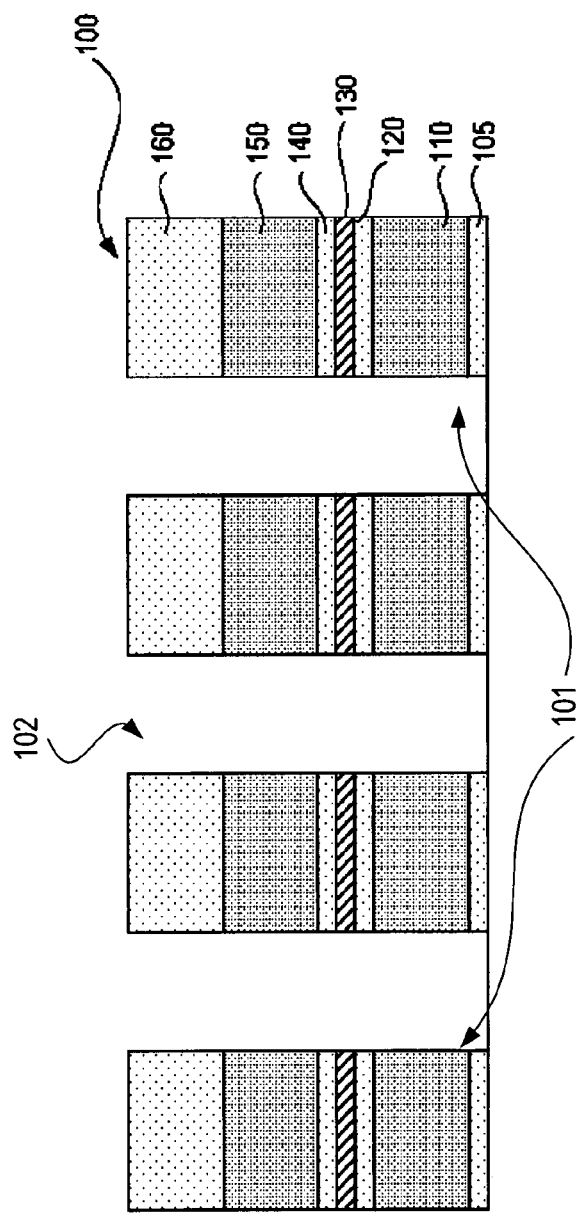
FIG. 1 illustrates an example substrate including an array of patterned stacks, according to one embodiment.

FIG. 1 illustrates an example substrate including an array of patterned stacks 100 (e.g., gate wordlines (WL)) formed by a standard lithography/etch/cleaning sequence with trenches therebetween (e.g., source trench 101, drain trench 102). The patterned stacks 100 may include from bottom to top, a thin oxide layer 105, a polysilicon layer 110, an oxide layer 120, a nitride layer 130, an oxide layer 140, a polysilicon layer 150, and an oxide layer 160. The stacks 100 are not limited to the illustrated configuration.

Figure 2:
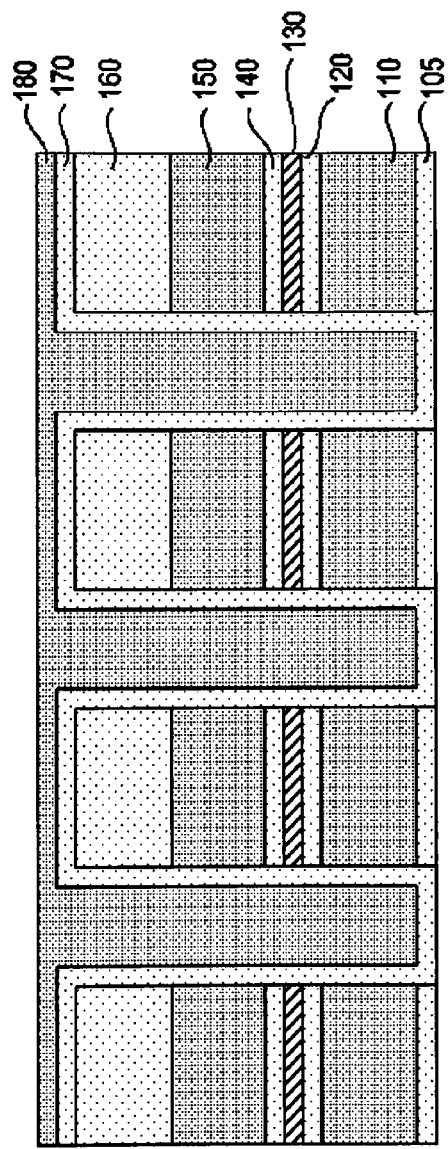
FIG. 2 illustrates the example substrate after formation of an oxide spacer and deposition of a sacrificial polysilicon, according to one embodiment.

FIG. 2 illustrates the example substrate after the formation of a spacer layer 170 (e.g., oxide) over the stacks 100 and in the trenches 101, 102 followed by deposition of a sacrificial polysilicon 180 over the stacks 100 and to fill within the trenches 101, 102.

Figure 3:
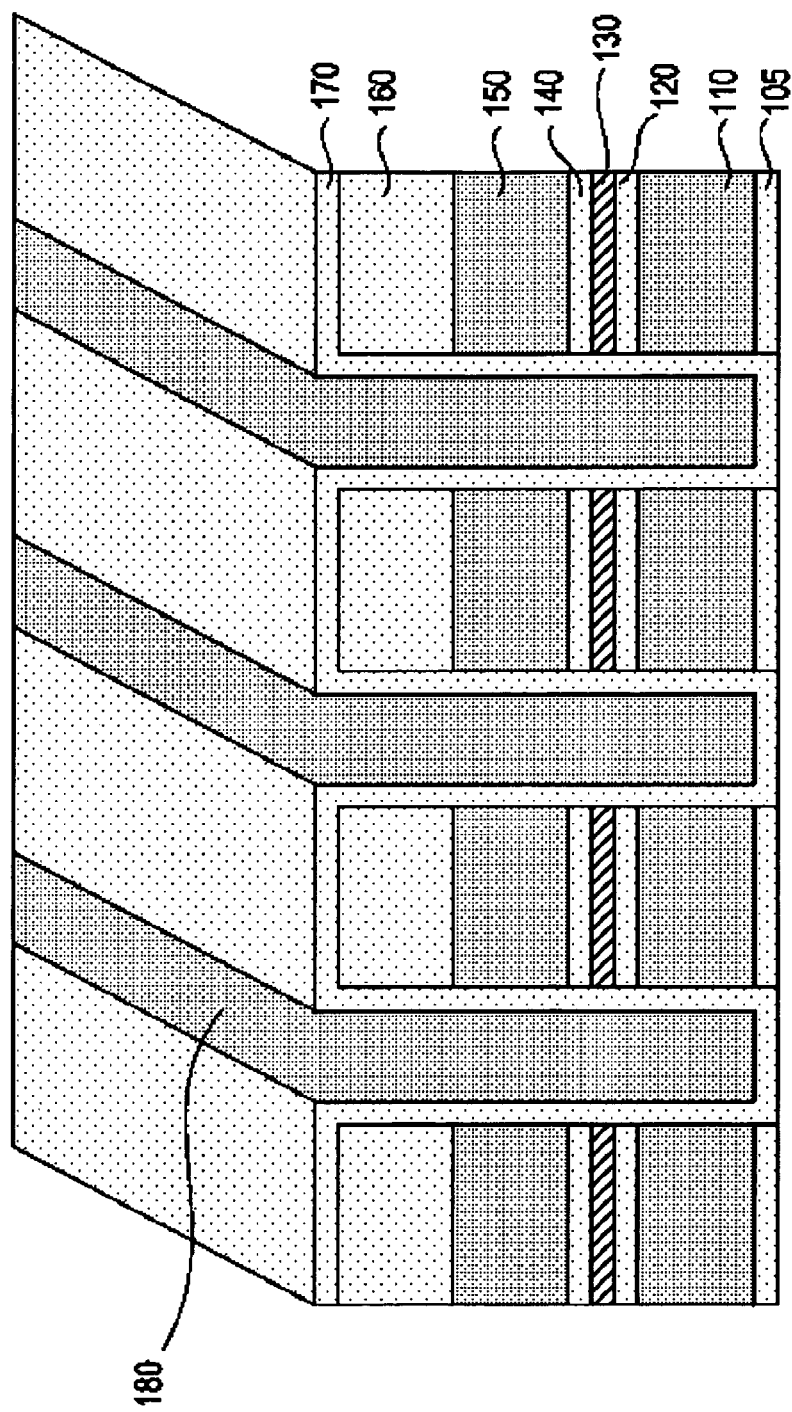
FIG. 3 illustrates the example substrate after the sacrificial polysilicon is etched, according to one embodiment.

FIG. 3 illustrates the example substrate after the sacrificial polysilicon 180 is etched so as to remove it from the stacks 100 (the spacer layer 170 on top of the stacks 100) and so that the height of it within the trenches 101, 102 is substantially equal with or slightly recessed from the spacer layer 170 on the top of the stacks 100.

Figure 4:
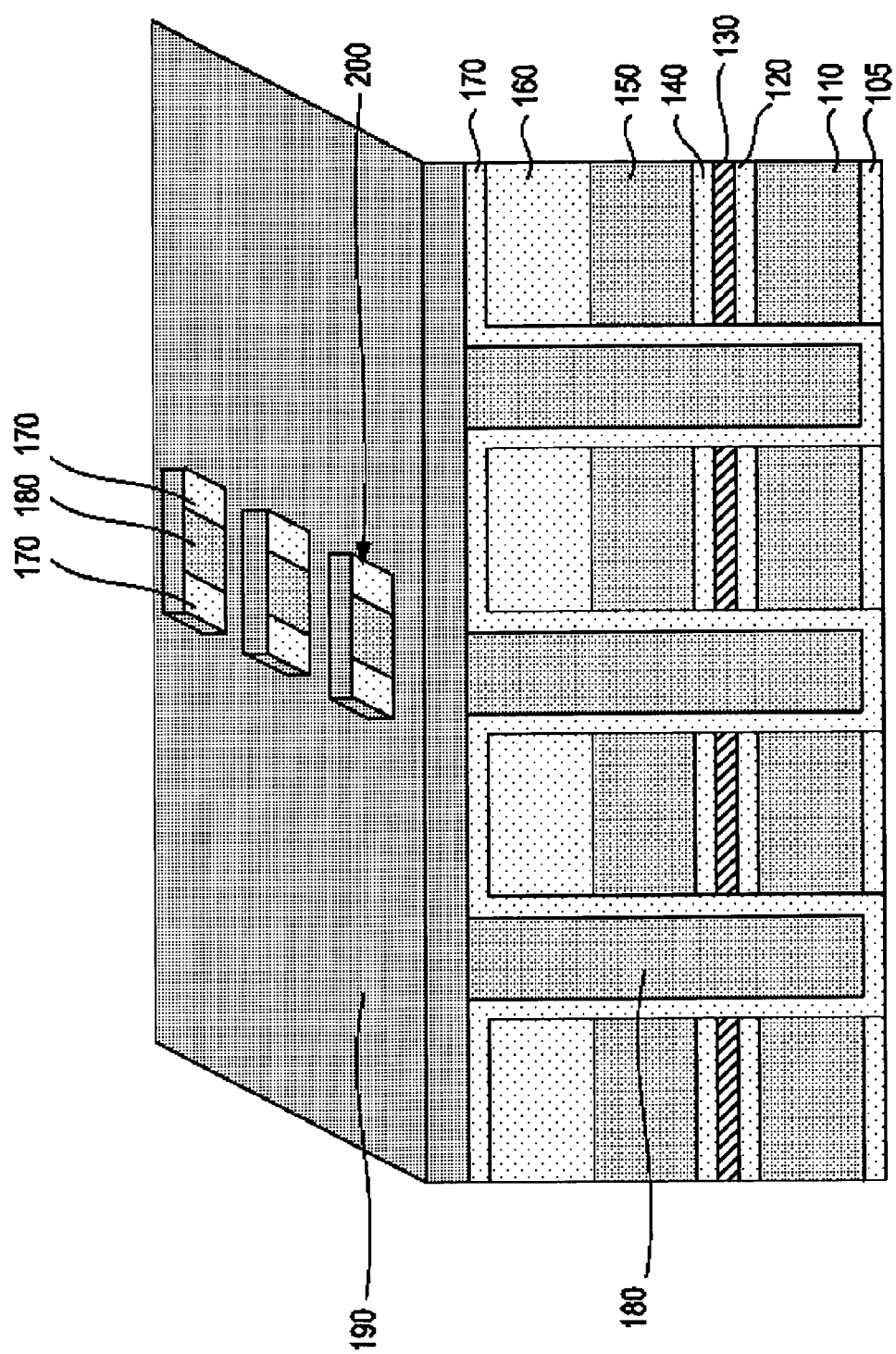
FIG. 4 illustrates the example substrate after deposition and patterning of a nitride layer to form isolation regions, according to one embodiment.

FIG. 4 illustrates the example substrate after the deposition of a patterning layer 190 (e.g., nitride) and patterning of the same to form isolation regions (e.g., drain isolation region) 200 over the trench 102 so that the sacrificial polysilicon 180 can be etched therebelow (sacrificial polysilicon patterning). The isolation regions 200 may expose the sacrificial polysilicon 180 and the spacer layer 170 on each side thereof.

Figure 5:
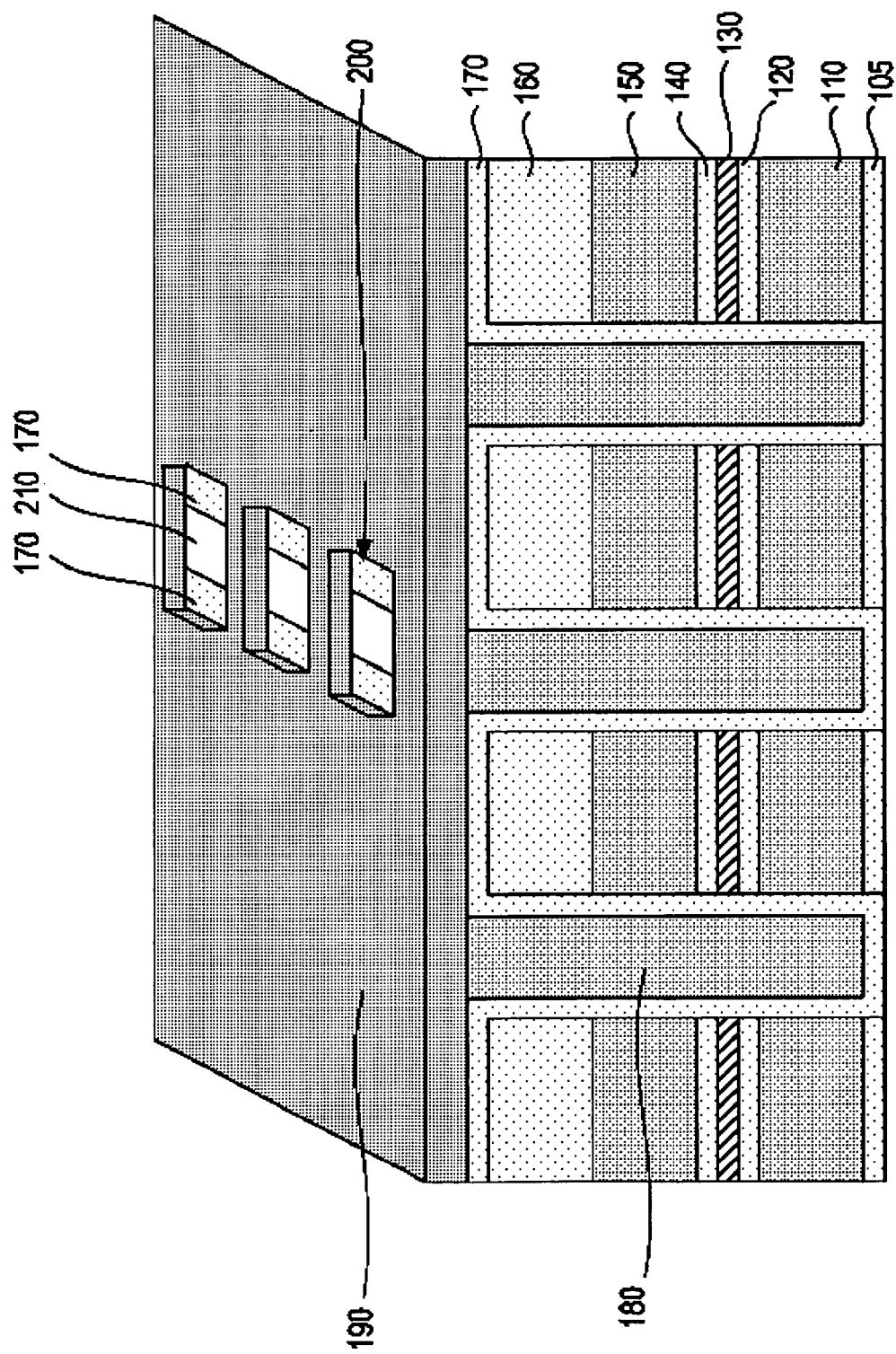
FIG. 5 illustrates the example substrate after the sacrificial polysilicon layer is etched (removed) below the isolation regions forming open isolation regions, according to one embodiment.

FIG. 5 illustrates the example substrate after the sacrificial polysilicon layer 180 is etched (removed) below the isolation regions 200 forming open isolation regions 210 (e.g., drain isolation regions). This is a first sacrificial polysilicon etch.

Figure 6:
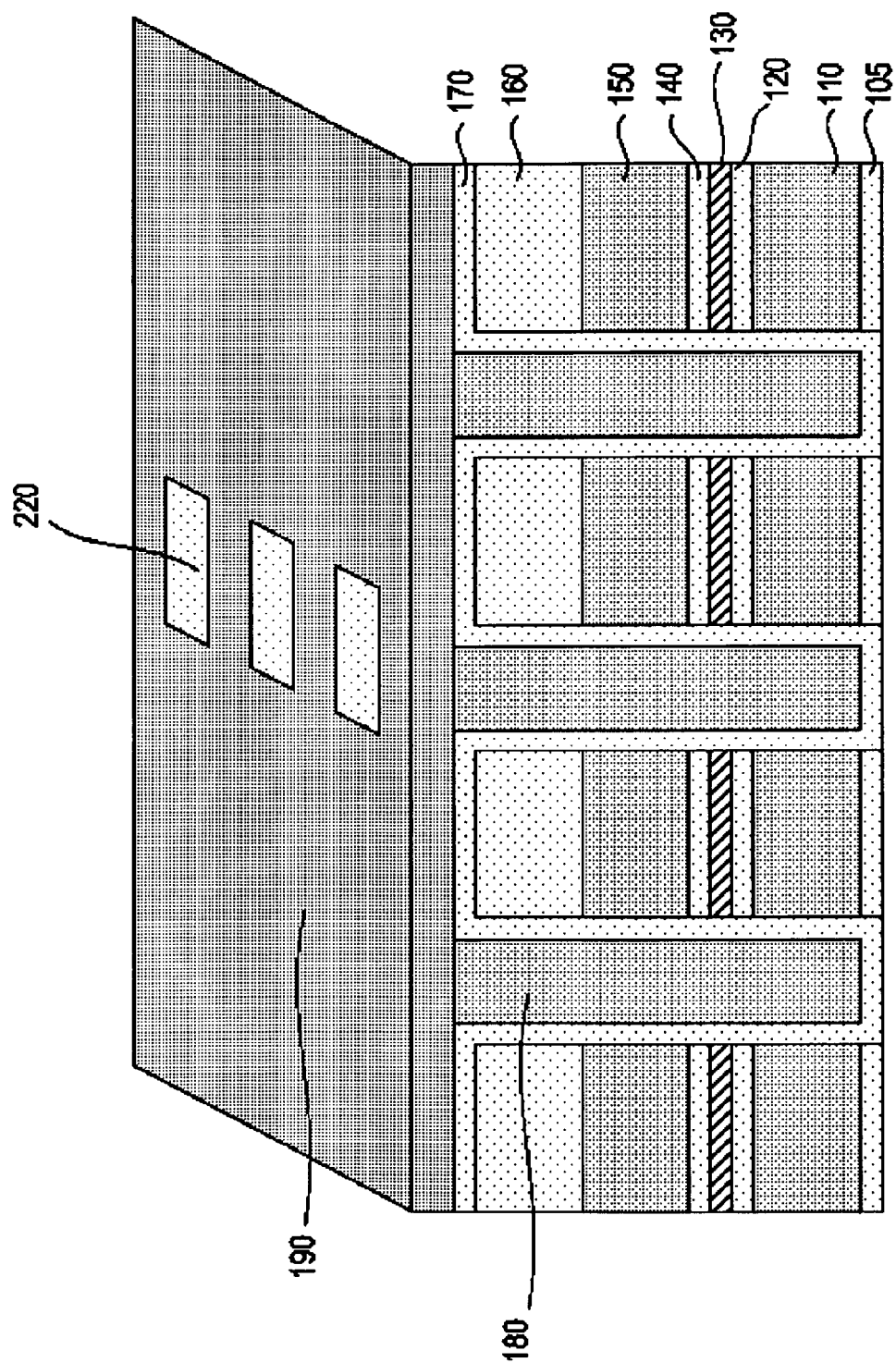
FIG. 6 illustrates the example substrate after an interlayer dielectric (ILD) material is deposited to form isolation plugs, according to one embodiment.

FIG. 6 illustrates the example substrate after an interlayer dielectric (ILD) material (e.g., HDP, HARP, SOD) is deposited into the open isolation regions (e.g., drain isolation regions) and is polished to the patterning layer 190 to form isolation plugs (e.g., drain isolation plugs) 220.

Figure 7:
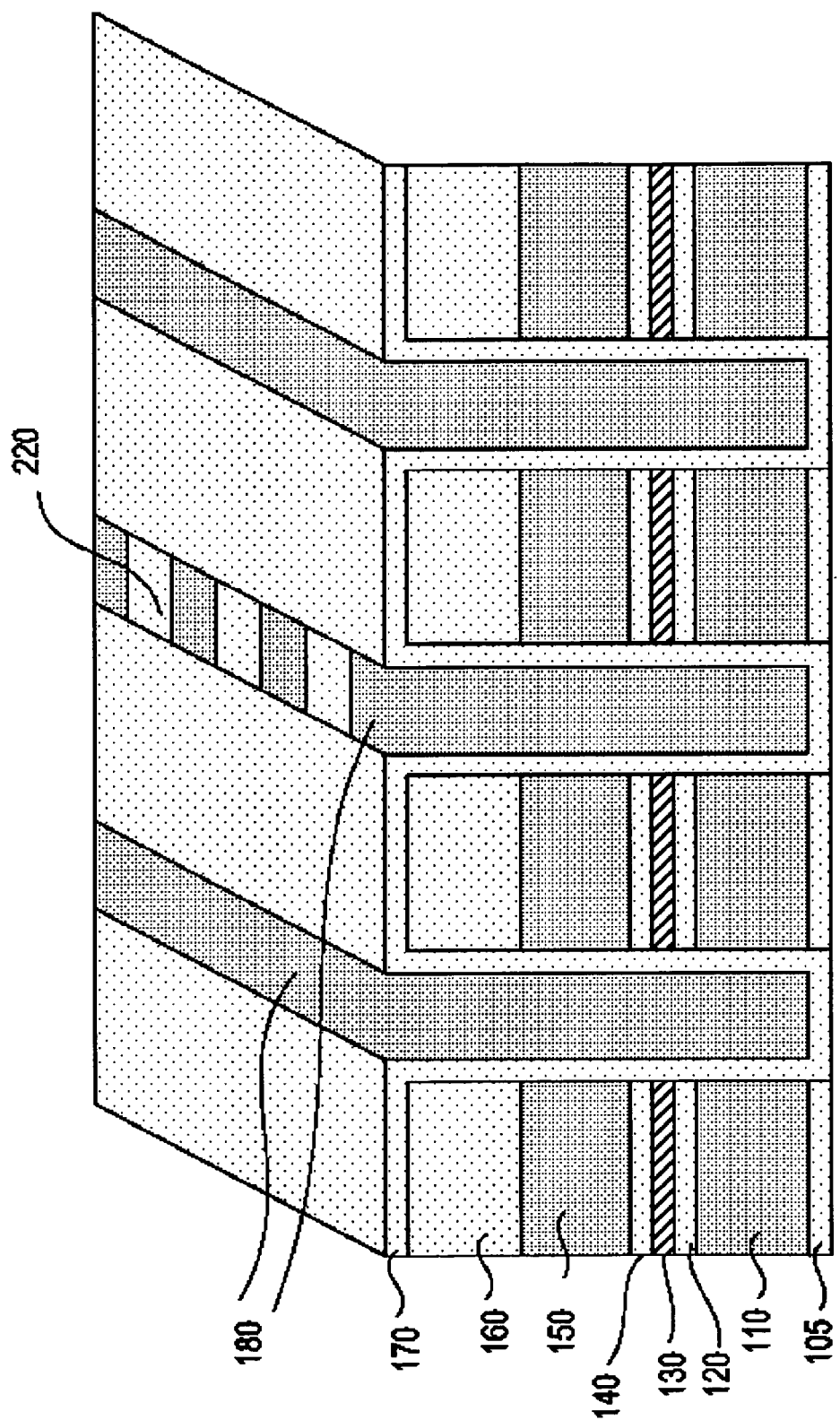
FIG. 7 illustrates the example substrate after the patterning layer is etched back to expose the remaining sacrificial polysilicon in the trenches, according to one embodiment.

FIG. 7 illustrates the example substrate after the patterning layer 190 is etched back to expose the remaining sacrificial polysilicon 180 in the trench 102 (e.g., active drain regions) and in the trenches 101 (e.g., source rail regions).

Figure 8:
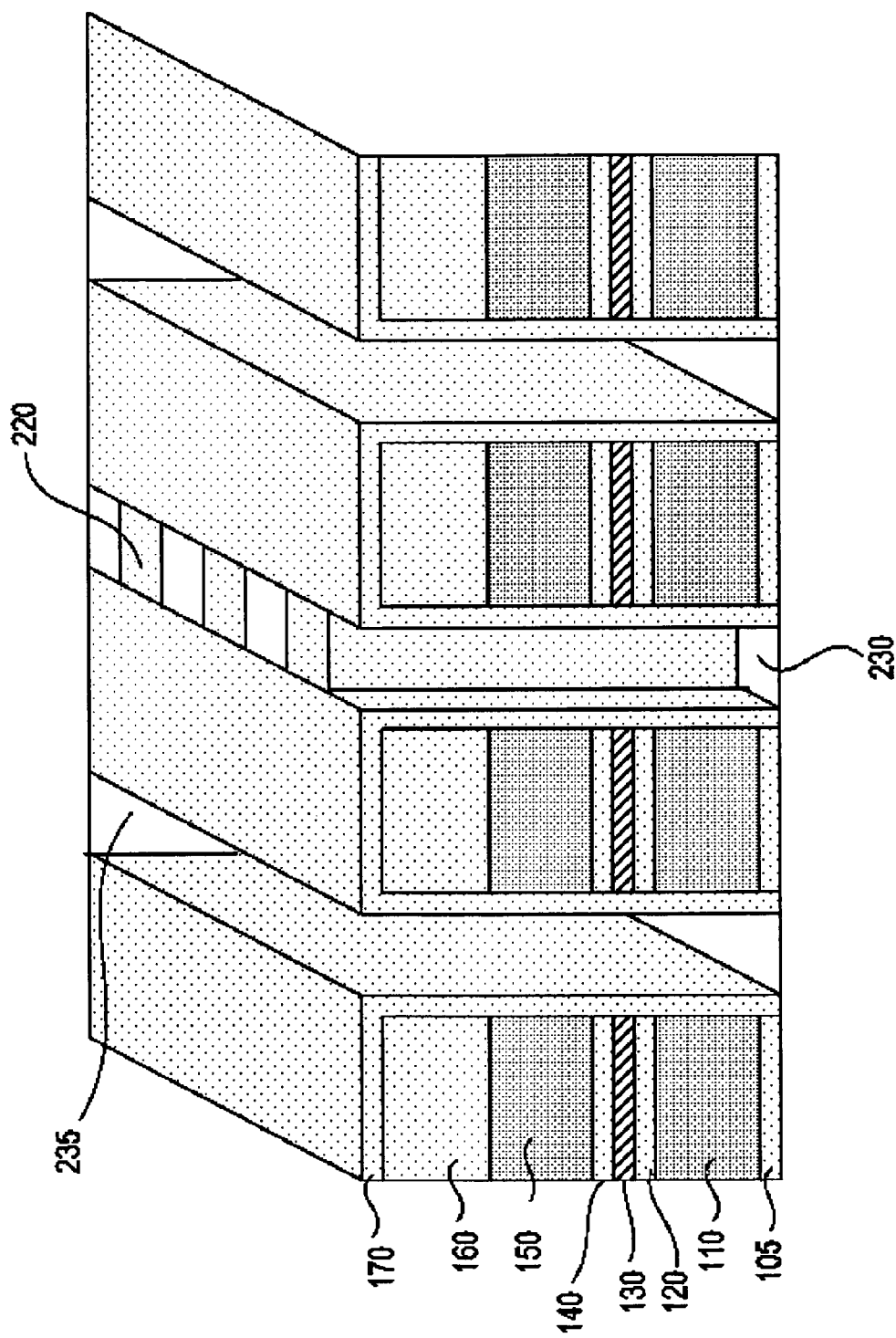
FIG. 8 illustrates the example substrate after the remaining sacrificial polysilicon and the spacer layer at the base of the trenches is etched, according to one embodiment.

FIG. 8 illustrates the example substrate after the remaining sacrificial polysilicon 180 is etched (second sacrificial polysilicon etch) and the spacer layer 170 at the base of the trenches 101, 102 is etched leaving open contact regions 230 (e.g., drain contact regions 235) and open contact regions 235 (e.g., source rail contact regions).

Figure 9:
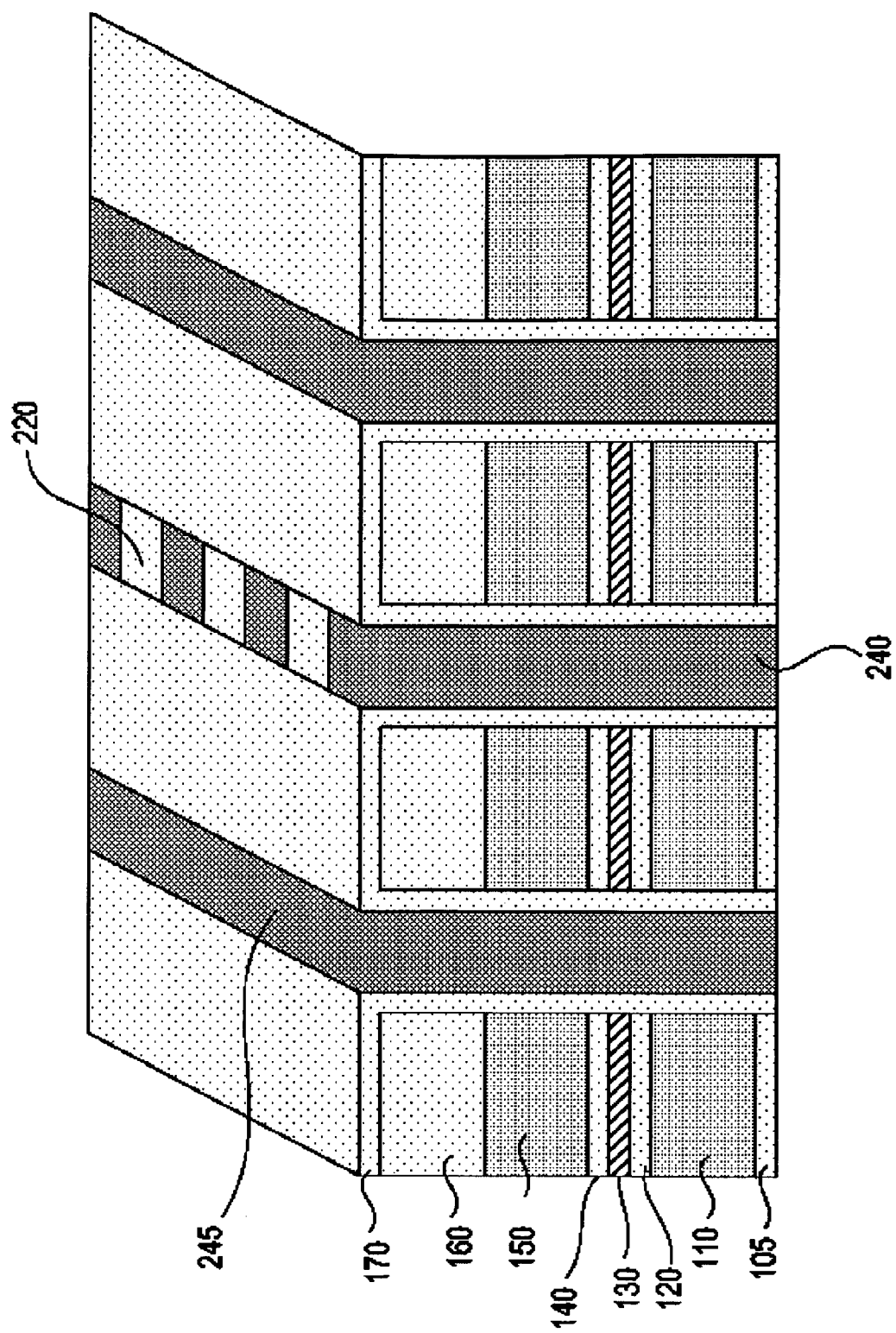
FIG. 9 illustrates the example substrate after contact plugs are formed in the trenches, according to one embodiment.

FIG. 9 illustrates the example substrate after contact plugs (e.g., drain contact plugs 240 and source rail contact plugs 245) are formed in the open contact regions 230, 235 respectively. The contact plugs 240, 245 may be doped polysilicon or tungsten.

It should be noted that the various embodiments described herein focused on the use of PSAC to form drain isolation plugs, drain contact plugs, and source rail contact plugs but is not limited to these. Rather, PSAC can be used to form various types of plugs in various types of devices. Furthermore, the various embodiments described herein focused on a process that included a sacrificial polysilicon patterning followed by two sacrificial polysilicon etchings but is not limited thereto. Rather, the number and order of sacrificial polysilicon patterning and sacrificial polysilicon etchings can vary depending on the type and number of PSAC (plugs) being formed.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. A method comprising:
    forming a spacer layer over a substrate having patterned stacks formed therein and trenches between the patterned stacks;
    depositing a sacrificial polysilicon layer over the substrate to fill the trenches;
    depositing a patterning layer over the substrate;
    patterning the patterning layer to define contact regions over at least a portion of the trenches;
    etching the sacrificial polysilicon layer using the patterned patterning layer as a mask to form open isolation regions;
    depositing an isolation layer within the open isolation regions;
    removing the patterning layer to expose portions of the sacrificial polysilicon layer remain after the etching the sacrificial polysilicon layer;
    etching the remaining portions of sacrificial polysilicon layer to form open contact regions;
    etching the spacer layer below the open contact regions; and
    depositing a contact layer within the open contact regions.

2. The method of claim 1, wherein the forming a spacer layer includes forming an oxide spacer layer over the substrate.

3. The method of claim 1, further comprising etching the sacrificial polysilicon layer so that height of the sacrificial polysilicon within the trenches is substantially equal to height of the spacer layer on the stacks.

4. The method of claim 1, wherein the depositing a patterning layer includes depositing a nitride patterning layer over the substrate.

5. The method of claim 1, wherein the depositing a contact layer includes depositing tungsten within the open contact regions.

6. The method of claim 1, wherein the depositing a contact layer includes depositing doped polysilicon within the open contact regions.

7. The method of claim 1, wherein the depositing an isolation layer includes depositing an interlayer dielectric (ILD) material within the open isolation regions.

8. A method comprising
    forming an oxide spacer layer over a substrate having patterned word line gate stacks and drain and source trenches formed therein;
    depositing a sacrificial polysilicon layer over the substrate to fill the drain and source trenches;
    etching the sacrificial polysilicon layer so that height of the sacrificial polysilicon within the source and drain trenches is substantially equal to height of the oxide spacer layer on the wordline gate stacks;
    depositing a nitride patterning layer over the substrate;
    patterning the nitride patterning layer to define isolation regions over the drain trenches;
    etching the sacrificial polysilicon layer using the patterned nitride patterning layer to form open drain isolation regions;
    depositing an interlayer dielectric (ILD) material within the open drain isolation regions to form drain isolation plugs;
    removing the nitride patterning layer;
    etching remaining portions of the sacrificial polysilicon layer to form open drain contact regions and open source contact regions;
    etching the spacer layer below the open drain contact regions and the open source contact regions; and
    depositing a contact layer within the open drain contact regions and the open source contact regions to form drain contact plugs and source rail contact plugs.

9. The method of claim 8, wherein the depositing a contact layer includes depositing tungsten within the open drain contact regions and the open source contact regions.

10. The method of claim 8, wherein the depositing a contact layer includes depositing doped polysilicon within the open drain contact regions and the open source contact regions.

11. The method of claim 8, further comprising forming the patterned word line gate stacks and drain and source trenches.

12. A method comprising
    forming patterned word line gate stacks in a substrate;
    forming drain and source trenches in the substrate;
    forming a spacer layer over the patterned word line gate stacks, the drain trenches, and the source trenches;
    depositing a sacrificial polysilicon layer to fill the drain and source trenches;
    etching the sacrificial polysilicon layer so that height of the sacrificial polysilicon within the source and drain trenches is substantially equal to height of the spacer layer on the wordline gate stacks;
    depositing a patterning layer;
    patterning the patterning layer to define isolation regions over the drain trenches;
    etching the sacrificial polysilicon layer using the patterned patterning layer as a mask to form open drain isolation regions;
    depositing a dielectric material within the open drain isolation regions to form drain isolation plugs;
    removing the patterned patterning layer to expose portions of the sacrificial polysilicon layer remaining after the etching the sacrificial polysilicon layer;
    etching remaining portions of the sacrificial polysilicon layer to form open drain contact regions and open source contact regions;
    etching the spacer layer at bottom of the open drain contact regions and the open source contact regions to expose drain trench and source trench respectively; and
    depositing a contact layer within the open drain contact regions and the open source contact regions to form drain contact plugs and source rail contact plugs.

* * * * *